(12) United States Patent
Murakami et al.

(10) Patent No.: US 7,005,729 B2
(45) Date of Patent: Feb. 28, 2006

(54) DEVICE PACKAGING USING TAPE AUTOMATED BONDING (TAB) STRIP BONDED TO STRIP CARRIER FRAME

(75) Inventors: Yukihiro Murakami, Tsukuba (JP); Kinya Ichikawa, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 10/131,168

(22) Filed: Apr. 24, 2002

(65) Prior Publication Data

US 2003/0201524 A1 Oct. 30, 2003

(51) Int. Cl.
*H01L 23/495* (2006.01)

(52) U.S. Cl. .................... 257/676; 257/723; 257/777
(58) Field of Classification Search ............. 257/668, 257/676, 673, 623, 777, 684, 685–686, 784, 257/737, 738, 690, 691, 692, 693, 723, 789, 257/689, 706, 695, 680, 786
See application file for complete search history.

(56) References Cited

U.S. PATENT DOCUMENTS

| | | | | |
|---|---|---|---|---|
| 5,717,252 A | * | 2/1998 | Nakashima et al. | |
| 6,362,022 B1 | * | 3/2002 | Hinkle et al. | ............... 438/123 |
| 6,445,077 B1 | * | 9/2002 | Choi et al. | |
| 6,552,419 B1 | * | 4/2003 | Toyosawa | |

* cited by examiner

*Primary Examiner*—Hoai Pham
*Assistant Examiner*—Dilinh Nguyen
(74) *Attorney, Agent, or Firm*—Blakely, Sokoloff, Taylor & Zafman LLP (57) ABSTRACT

In one embodiment of the invention, a die is bonded on a strip carrier frame having a carrier alignment landmark. A tape automated bonding (TAB) strip having a TAB alignment landmark is aligned with the strip carrier frame. The TAB strip is bonded to the strip carrier frame to form a bonded unit.

13 Claims, 6 Drawing Sheets

DEVICE PACKAGING USING TAPE AUTOMATED BONDING (TAB) STRIP BONDED TO STRIP CARRIER FRAME

BACKGROUND

1. Field

Embodiments of the invention relate to the field of packaging, and more specifically, to tape automated bonding.

2. Background

Tape Automated Bonding (TAB) is a packaging technique to provide a fine pitch interconnection of a chip to a prefabricated copper fingers and traces on a tape. The interconnections are patterned on a multi-layer polymer tape. The tape is positioned above the die so that the metal tracks on the polymer tape correspond to the bonding sites on the die.

Although TAB technology offers some advantages over wire bonding technology, it has a number of disadvantages. For high pin count semiconductor devices, the inner lead bond pads are formed around the die corner, leaving little space to form the tie bar to make the die bond pad on the TAB tape. Narrow tie bars may be formed but there will not be enough mechanical strength to maintain precise die pad locations. To provide precise inner lead bonding, the single point lead bonder needs to have a capability to hold the individual die and align with the TAB tape precisely during the inner lead bonding. This process requires expensive tooling for the die handling system and the die alignment system.

BRIEF DESCRIPTION OF THE DRAWINGS

The invention may best be understood by referring to the following description and accompanying drawings that are used to illustrate embodiments of the invention. In the drawings.

DESCRIPTION OF THE INVENTION

One embodiment of the present invention provides assembly for TAB packaging. A die is bonded on a strip carrier frame having a carrier alignment landmark. A tape automated bonding (TAB) strip having a TAB alignment landmark is aligned with the strip carrier frame. The TAB strip is bonded to the strip carrier frame to form a bonded unit.

In the following description, numerous specific details are set forth. However, it is understood that embodiments of the invention may be practiced without these specific details. In other instances, well-known circuits, structures, and techniques have not been shown in order not to obscure the understanding of this description.

It is noted that an embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a method of assembly or manufacturing, a procedure, etc.

Figure 1:
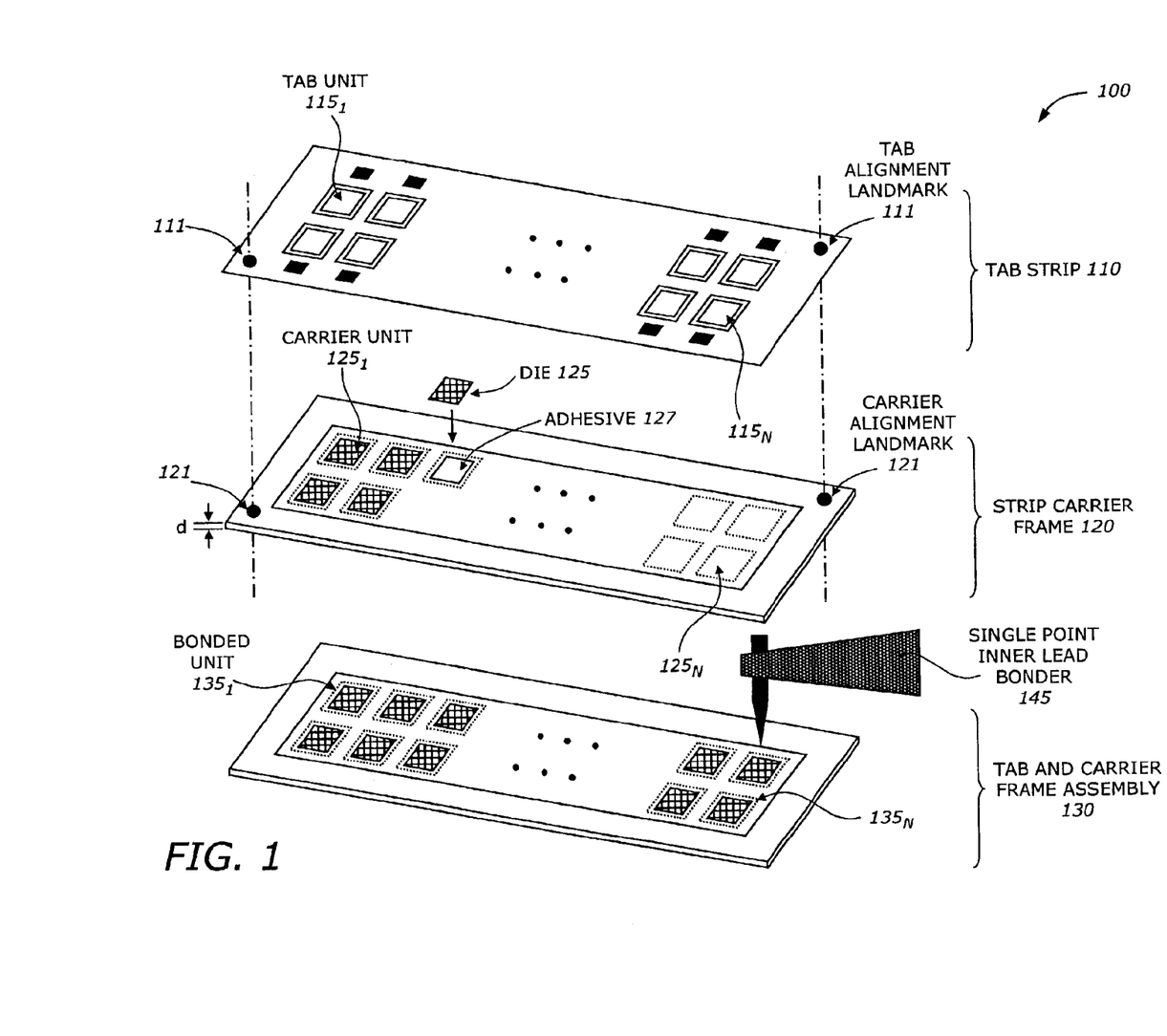
FIG. 1 is a diagram illustrating an overall process in which one embodiment of the invention can be practiced.

FIG. 1 is a diagram illustrating an overall process 100 in which one embodiment of the invention can be practiced. The process 100 includes formation of a TAB and carrier frame assembly 130 from a TAB strip 110 and a strip carrier frame 120.

The TAB strip 110 has a number of TAB alignment landmarks 111 for alignment purposes. These landmarks are typically located at the corners of the TAB strip 110. They may be specially made marks or holes which can be recognized by mechanical or optical alignment tools. An example of the TAB alignment landmark is the sprocket hole in the TAB tape. The TAB strip 110 includes an array of N TAB units $115_1$ to $115_N$ corresponding to N devices in the packaging assembly. Each of the TAB units $115_1$ to $115_N$ includes an interconnection pattern and corresponding inner leads.

The strip carrier frame 120 also has a number of carrier alignment landmarks 121 for alignment with the TAB strip 110. These landmarks are typically located at the corners of the strip carrier frame 120. They may be specially made marks or holes which can be recognized by mechanical or optical alignment tools. The strip carrier frame 120 includes an array of N carrier units $125_1$ to $125_N$ corresponding to N devices in the packaging assembly. The strip carrier frame 120 provides mechanical support for the TAB strip 110 during the packaging process because the TAB strip 110 is typically thin and made of flexible substrate and is difficult to handle. The strip carrier frame 120 is made of any material with sufficient strength. Examples of the material include copper or 42 alloy. The strip carrier frame 120 has a thickness "d" which depends on the application. Typical values of d are in the range of 100 to 150 $\mu$m. The strip carrier frame 120 can be manufactured at low cost using the lead frame manufacturing technology.

Each of the carrier units $125_1$ to $125_N$ includes a die 125 bonded to the strip carrier frame 120 via an adhesive 127. The die 125 corresponds to a chip or an integrated circuit. The die bonding is then thermally treated or cured. When all the dies are bonded to the strip carrier frame 120, the TAB strip 110 is then aligned with the strip carrier frame 120 using the TAB alignment landmarks 111 and the carrier alignment landmarks 121. The TAB strip 110 is then bonded to the strip carrier frame 120 using adhesive as will be described later to form the TAB and carrier frame assembly 130. The TAB and carrier frame assembly 130 contains N bonded units $135_1$ to $135_N$. The formation of the bonds is carried out using a single-point inner lead bonder 145. The TAB and carrier frame assembly 130 is then thermally treated or cured.

The technique provides at least one of the following advantages. First, the pick-and-place and die bonding tool provides high throughput and is cost effective because die bonding on the strip carrier frame is done at a module separate from the single-point bonder. Second, the die handling and alignment system is inexpensive because the strip carrier frame provides strong mechanical support to the TAB strip. Third, high yield manufacturing for "fan-in" structure of TAB lead can be achieved. Fourth, damage to the die can be avoided because the fan-in structure is bonded on the die. Fifth, by keeping the strip carrier frame after assembly through cutting it out to fit the bonded units with the package outline, the carrier frame may act as a stiffener, heat spreader and electromagnetic shield.

After the process, each of the bonded units $135_1$ to $135_N$ is isolated or punched out from the TAB and carrier frame assembly 130 using conventional pouching mold or any kind of dicing tool like dicing saw or laser cut.

Figure 2:
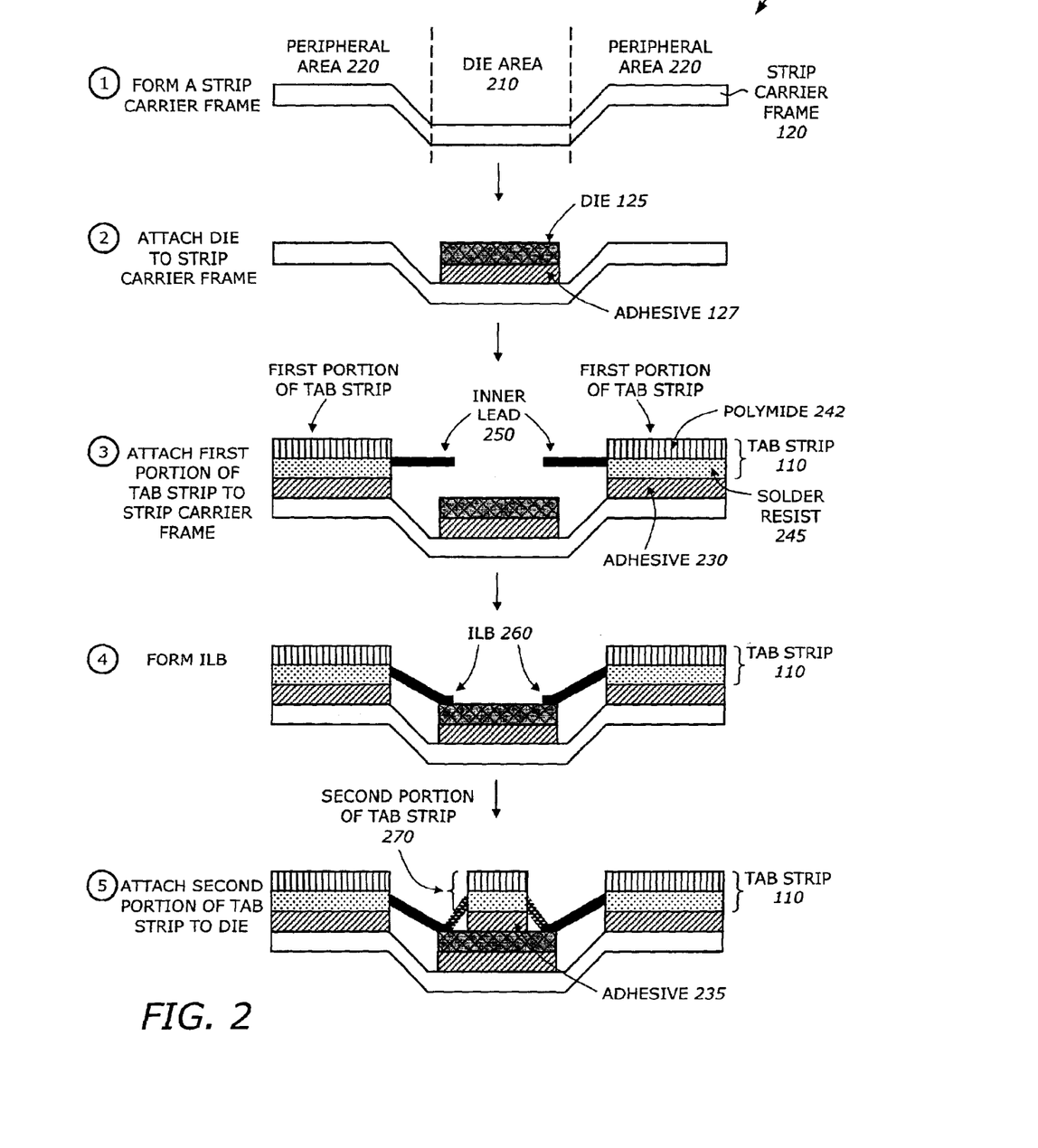
FIG. 2 is a diagram illustrating a sequence of steps to form a packaged assembly according to one embodiment of the invention.

FIG. 2 is a diagram illustrating a sequence 200 of stages, phases, or steps to form a packaged assembly according to one embodiment of the invention. The sequence 200 includes five stages.

In stage 1, a strip carrier frame 120 is formed. The strip carrier frame 120 may be manufactured by the lead frame manufacturing technology. It may be made by mold punch or half etch process. The strip carrier frame 120 has two areas: a die area 210 and a peripheral area 220. The die area 210 is a place where the die will be bonded. Typically, the peripheral area 220 is raised above the die area 210 to facilitate the inner lead bonding and to maintain proper spacing.

In stage 2, the adhesive 127 is pasted on the strip carrier frame 120 at the die area 210. The adhesive 127 may be any suitable material such as silver paste, adhesive polymer paste, or film. The die 125 is then attached to the strip carrier frame 120 via the adhesive 127.

In stage 3, the TAB strip 110 is aligned with the strip carrier frame 120. An adhesive 230 is pasted on the peripheral area 220. A first portion of the TAB strip 110 is then attached to the strip carrier frame 120 at the peripheral area 220 around the die area 210 via the adhesive 230. The TAB strip 110 includes a polyimide layer 242 and a solder resist layer 245. The TAB strip 110 also includes a number of inner leads 250 coming out from the interconnection patterns on the metal tracks of the polymer tape.

In stage 4, an inner lead bond (ILB) 260 is formed using the single-point inner lead bonder to bend or force the inner leads 250 to bonding pads on the die 125. These ILBs correspond to the fan-out traces of the die 125. Fan-out traces are those traces that connect the input/output (I/O) pads located outside the die area 210 to the bonding pads on the die 125. Stage 4 may be the final stage if there are no fan-in traces.

In stage 5, an adhesive 235 is pasted on the die 125. A second portion 270 of the TAB strip 110 is then attached to the die 125 via the adhesive 235. This portion also has inner leads. The ILBs are then formed for these inner leads which correspond to fan-in traces. Fan-in traces are those traces that connect pads inside the die to the bonding pads.

Figure 3:
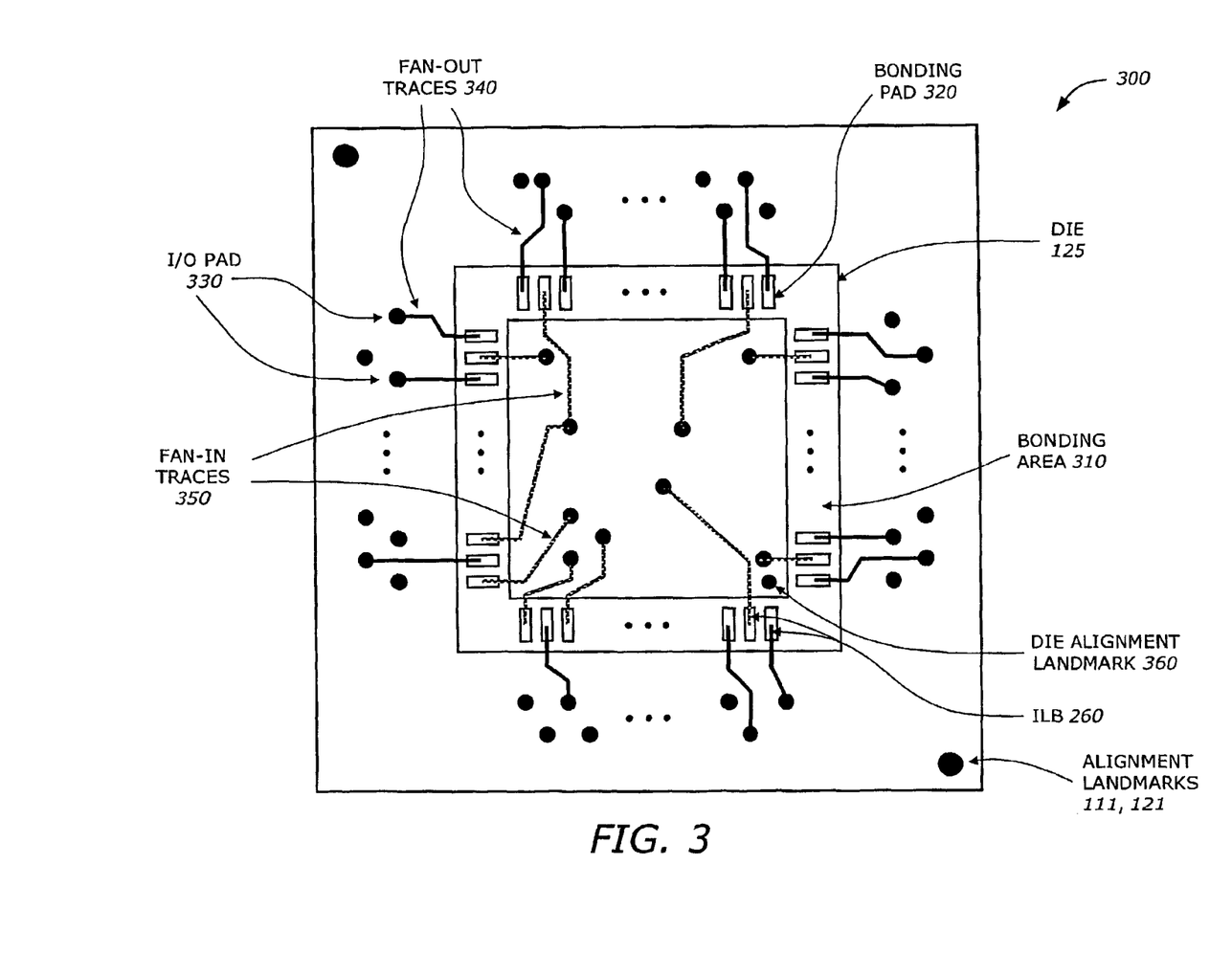
FIG. 3 is a diagram illustrating an interconnection pattern according to one embodiment of the invention.

FIG. 3 is a diagram illustrating an interconnection pattern 300 according to one embodiment of the invention.

The die 125 has a bonding area 310 which typically is at the outline area of the die 125. The die 125 may also have a die alignment landmark 360 for alignment purposes if necessary. The bonding area 310 contains a number of bonding pads 320. These bonding pads 320 are located around the die 125.

Outside the die 125 are the I/O pads 330 that are available for connection to the external devices. The traces that connect the I/O pads 330 to the bonding pads 320 are the fan-out traces 340. The inner leads coming out of the TAB strip that correspond to the fan-out traces are bonded to the bonding pads 320 at the inner lead bonds (ILB) 260.

Figure 4:
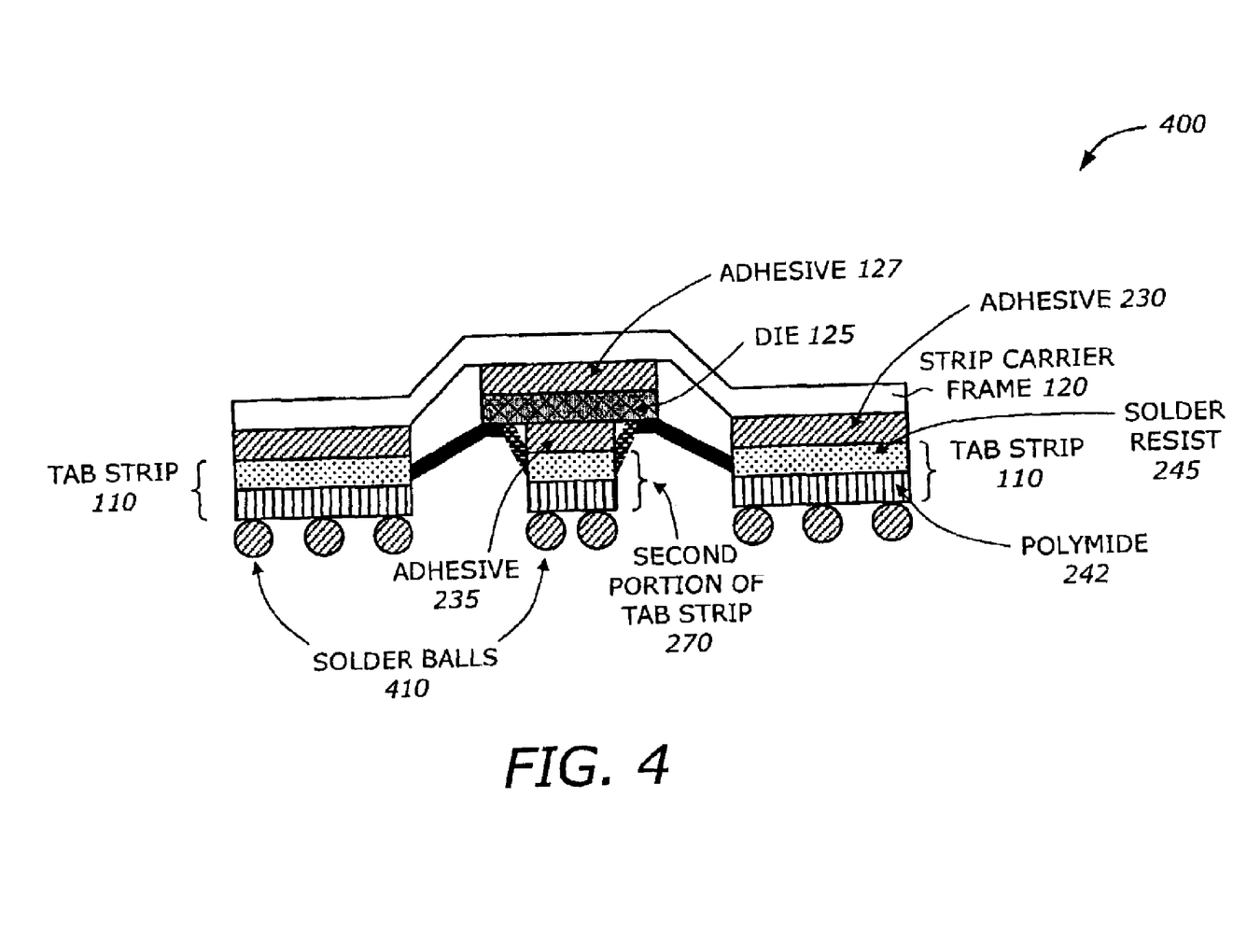
FIG. 4 is a diagram illustrating a packaged device according to one embodiment of the invention.

FIG. 4 is a diagram illustrating a packaged device 400 according to one embodiment of the invention. The packaged device 400 corresponds to one of the bonded units $135_1$ to $135_N$ as shown in FIG. 1. The packaged device 400 is created as result of the packaging assembly process as described in FIGS. 1 and 2. Note that the packaged device 400 may include less than the components as discussed above.

The packaged device 400 includes a carrier from the strip carrier frame 120 (FIG. 1), the die 125 bonded to the carrier at the die area via the adhesive 127, and a first portion of TAB strip 110 bonded to the carrier at the peripheral area via the adhesive 230. The first portion has a number of inner leads bonded to the die 125 at inner lead bond (ILB) pads. These inner leads correspond to the fan-out traces.

The packaged device 400 also includes a second portion 270 of the TAB strip 110 which is bonded to the die 125 via the adhesive 235. The second portion 270 has inner leads bonded to the die 125 at the ILB pads. These inner leads correspond to the fan-in traces.

The packaged device 400 may also includes a number of solder bumps 410 attached to the first portion of the TAB strip to provide interconnections. The solder bumps 410 may be solder balls that are attached to the TAB strip 110 either at the peripheral area, the die area, or both. These solder bumps 410 are used to attach the bonded unit 400 to another device, a motherboard, or any other interconnecting element.

Figure 5:
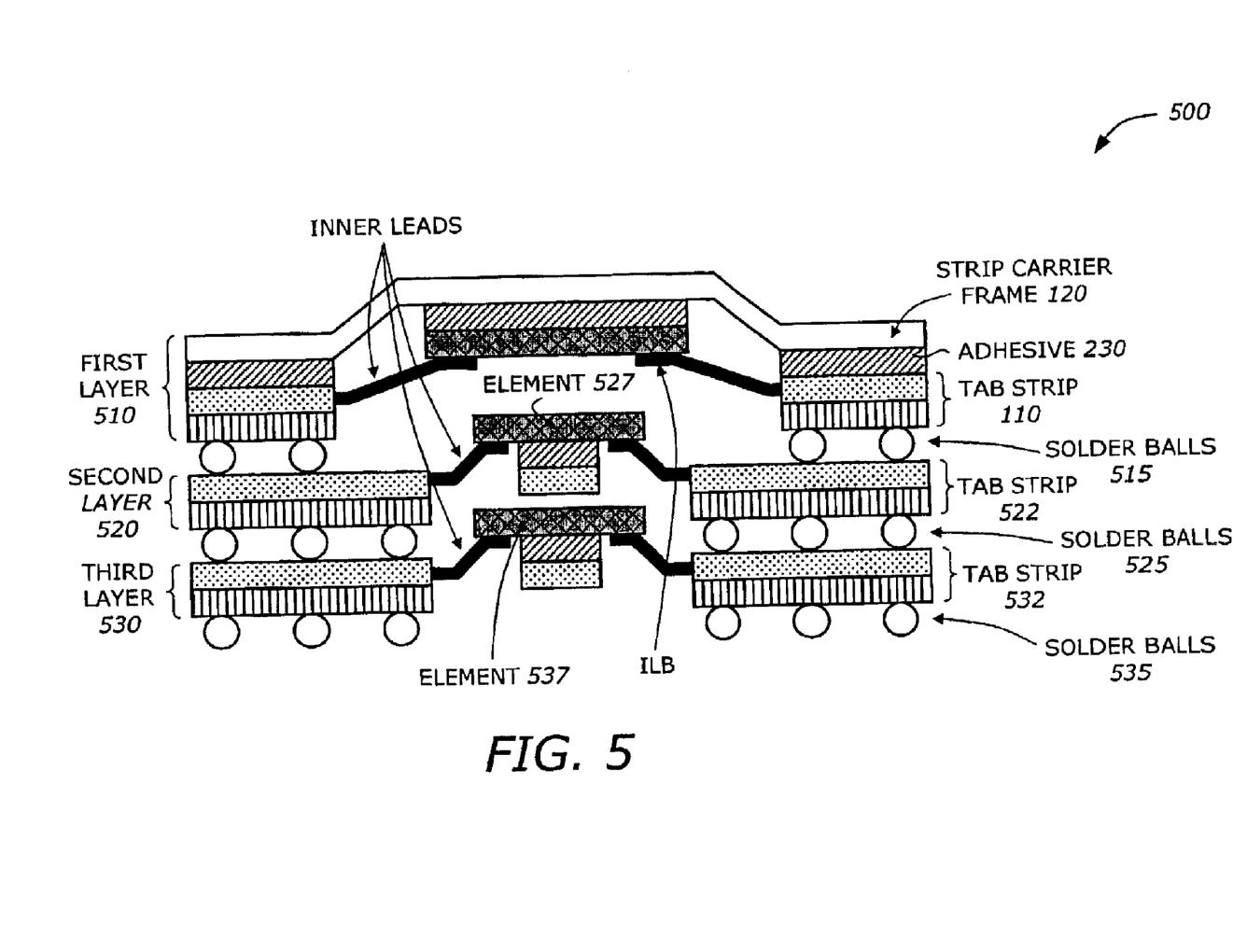
FIG. 5 is a diagram illustrating a multi-layered packaged device according to one embodiment of the invention.

FIG. 5 is a diagram illustrating a multi-layered packaged device 500 according to one embodiment of the invention. The multi-layered packaged device 500 includes a number of layers. For illustrative purposes, three layers are shown in FIG. 5: a first layer 510, a second layer 520, and a third layer 530. As is known by one skilled in the art, more or less number of layers may be used.

The first layer 510 includes the main bonded unit similar to the one shown in FIG. 4 without the second portion 270. The first layer 510 has solder balls 515 to provide interconnection to the second layer 520. The second layer 520 includes a TAB strip 522 and element 527. The element 527 may be a die or any element having electrical connections to the first layer 510 via the solder balls 515. The second layer 520 has solder balls 525 to provide interconnections to the third layer 530. The third layer 530 is similar to the second layer 520 and includes a TAB strip 532 and element 537. The element 537 may be a die, an integrated circuit, or any element having electrical connections to the second layer 520 and/or the first layer 510. The third layer 530 has solder balls 535 to provide interconnections to other layers or elements or a motherboard.

The stacking of the layers 510, 520, and 530 provide significant space saving and modular construction of a packaged multi-layer module. High power dissipation devices such as logic integrated circuits may be located in the first layer 510 where the die is attached to the strip carrier frame 120.

Figure 6:
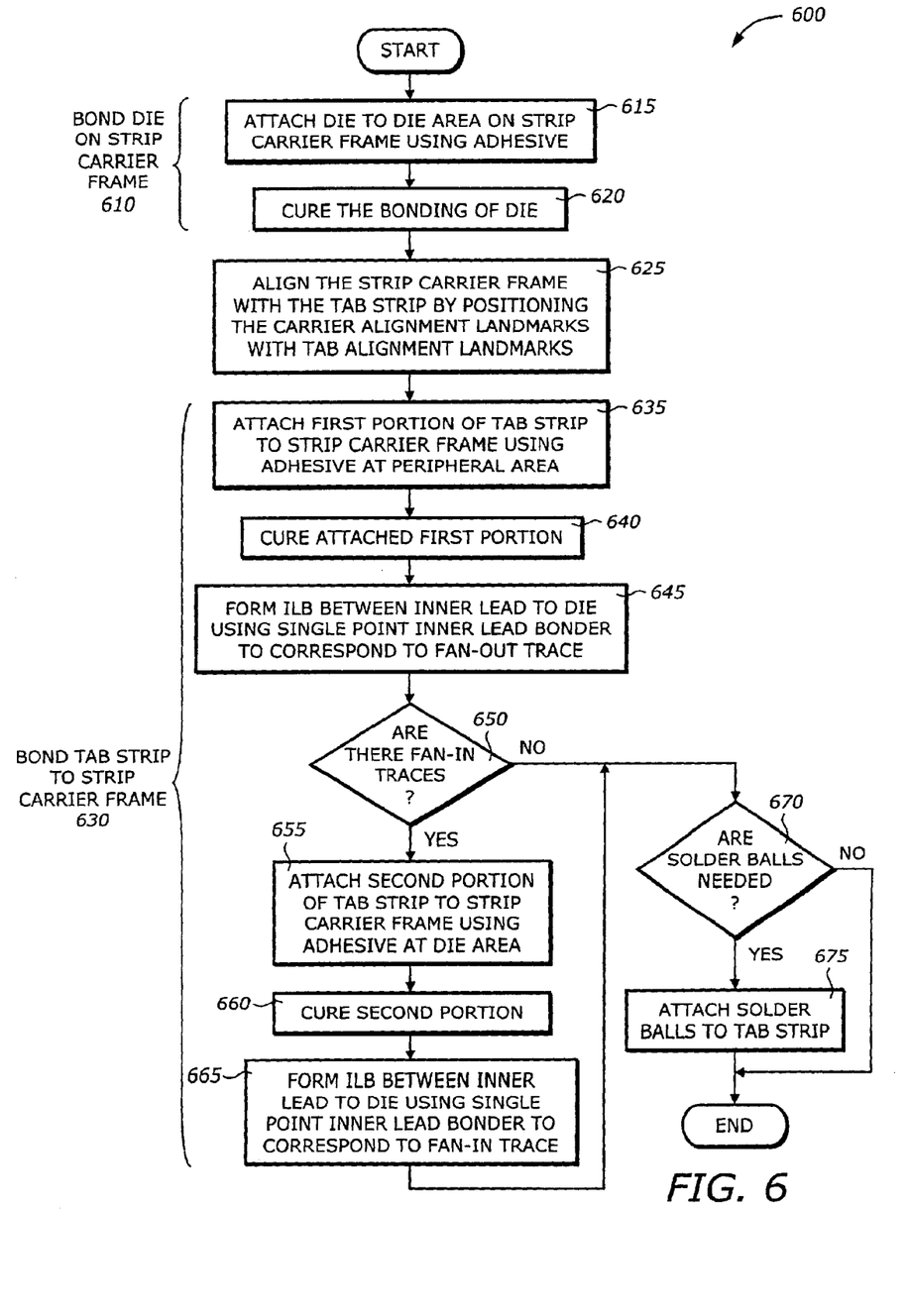
FIG. 6 is a flowchart illustrating a process to form a packaged assembly according to one embodiment of the invention.

FIG. 6 is a flowchart illustrating a process 600 to form a packaged assembly according to one embodiment of the invention. The process 600 includes three major stages 610, 625, and 630.

Upon START, the process 600 bonds the dies on the strip carrier frame (Stage 610). This stage includes attaching the die to the strip carrier frame at the die area using an adhesive (Block 615), and curing the bonding of the die using thermal cure (Block 620). Next, the process 600 aligns the strip carrier frame with the TAB strip by positioning the carrier alignment landmarks with the TAB alignment landmarks (Block 625).

Then, the process 600 bonds the TAB strip to the strip carrier frame (Stage 630). This stage includes blocks 635, 640, 645, 650, 655, 660 and 665. The process attaches the first portion of the TAB strip to the strip carrier frame using an adhesive at the peripheral area (Block 635). Then, the process 600 cures the attached first portion via a thermal curing (Block 640). Next, the process 600 forms an inner lead bond (ILB) between the inner lead of the first portion to the die using a single-point inner lead bonder to correspond to a fan-out trace (Block 645). Then, the process 600 determines if there are fan-in traces (Block 650). If so, the process 600 attaches the second portion of the TAB strip to the strip carrier frame using an adhesive at the die area (Block 655). Then, the process 600 cures the second portion using a thermal curing process (Block 660). Next, the process 600 forms an inner lead bond (ILB) between the inner lead of the second portion to the die using a single-point inner lead bonder to correspond to a fan-in trace (Block 665). The process 600 then goes to Block 670.

If there are no fan-in traces, the process determines if it is necessary to provide solder balls (Block 670). If so, the process 600 attaches solder balls to the TAB strip (Block 675) and is then terminated. Otherwise, the process 600 is terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A package assembly comprising:
   a strip carrier frame having a carrier alignment landmark;
   a die bonded to the strip carrier frame;
   a first portion of a TAB strip bonded to the strip carrier frame to form a bonded unit, the TAB strip having a TAB alignment landmark, the TAB strip and the strip carrier being aligned using the TAB and carrier alignment landmarks;
   a plurality of solder bumps attached to the TAB strip to provide interconnections; and
   a layer attached to the plurality of solder bumps, the layer having an element electrically connected to the die via the solder bumps.

2. The package assembly of claim 1 wherein the die is bonded to the strip carrier at a die area using a first adhesive.

3. The package assembly of claim 1 wherein the TAB strip comprises a first portion of the TAB strip bonded to the strip carrier at a peripheral area using a second adhesive.

4. The package assembly of claim 3 further comprising:
   a first inner lead from the first portion of the TAB strip bonded to the die at a first inner lead bond (ILB) pad by a single point inner lead bonder, the first inner lead corresponding to a fan-out trace.

5. The package assembly of claim 4 further comprises a second portion of the TAB strip bonded to the die at the die area via a third adhesive.

6. The package assembly of claim 5 further comprising:
   a second inner lead from the second portion of the TAB strip bonded to the die at one of the first ILB pad and a second ILB pad by a single point inner load bonder, the second inner lead corresponding to a fan-in trace.

7. A device comprising:
   a carrier;
   a first die bonded to the carrier at a die area via a first adhesive;
   a first portion of a first tape automated bonding (TAB) strip bonded to the carrier at a peripheral area via a second adhesive, the first portion having first inner leads bonded to the first die at inner lead bond (ILB) pads, the first inner leads corresponding to fan-out traces;
   a first plurality of solder bumps attached to the first portion of the first TAB strip to provide interconnections; and
   a first layer attached to the first plurality of solder bumps, the first layer having a first element electrically connected to the first die via the first plurality of solder bumps.

8. The device of claim 7 further comprising:
   a second portion of the TAB strip bonded to the first die at the die area via a third adhesive, the second portion having second inner leads bonded to the first die at the ILB pads, the second inner leads corresponding to fan-in traces.

9. The device of claim 7 wherein the first layer comprises:
   a second TAB strip having second inner leads bonded to the first element, the second TAB strip attached to the first portion of the first TAB strip via the first plurality of solder bumps.

10. The device of claim 9 further comprising:
    a second plurality of solder bumps attached to the first layer to provide interconnections; and
    a second layer attached to the second plurality of solder bumps, the second layer having a second element electrically connected to the die or the first element via the second plurality of solder bumps.

11. The device of claim 10 wherein the second layer comprises:
    a third TAB strip having third inner leads bonded to the second element, the third TAB strip attached to the second TAB strip via the second plurality of solder bumps.

12. The device of claim 10 wherein the second element is a second die or an integrated circuit.

13. The device of claim 7 wherein the first element is a second die or an integrated circuit.

* * * * *

UNITED STATES PATENT AND TRADEMARK OFFICE
CERTIFICATE OF CORRECTION

PATENT NO. : 7,005,729 B2
APPLICATION NO. : 10/131168
DATED : February 28, 2006
INVENTOR(S) : Murakami et al.

It is certified that error appears in the above-identified patent and that said Letters Patent is hereby corrected as shown below:

Column 1, at line 22, delete "comer" and insert --corner--.

Signed and Sealed this

Thirteenth Day of March, 2007

JON W. DUDAS
*Director of the United States Patent and Trademark Office*